United States Patent
Krasnov

(10) Patent No.: US 8,389,852 B2
(45) Date of Patent: Mar. 5, 2013

(54) ELECTRODE STRUCTURE FOR USE IN ELECTRONIC DEVICE AND METHOD OF MAKING SAME

(75) Inventor: Alexey Krasnov, Canton, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 1981 days.

(21) Appl. No.: 11/358,718

(22) Filed: Feb. 22, 2006

(65) Prior Publication Data

US 2007/0193623 A1 Aug. 23, 2007

(51) Int. Cl.
*H01L 31/00* (2006.01)

(52) U.S. Cl. ......... 136/252; 136/264; 136/265; 257/184

(58) Field of Classification Search .................. 136/264, 136/265, 252; 257/184
See application file for complete search history.

(56) References Cited

U.S. PATENT DOCUMENTS

| | | | |
|---|---|---|---|
| 5,214,008 A | 5/1993 | Beckwith et al. | |
| 5,477,088 A | 12/1995 | Rockett et al. | |
| 5,626,688 A * | 5/1997 | Probst et al. ................. | 136/265 |
| 5,981,868 A | 11/1999 | Kushiya et al. | |
| 6,261,693 B1 | 7/2001 | Veerasamy | |
| 6,521,558 B2 | 2/2003 | Landa et al. | |
| 6,573,207 B2 | 6/2003 | Landa et al. | |
| 6,576,349 B2 | 6/2003 | Lingle et al. | |
| 6,610,622 B1 | 8/2003 | Landa et al. | |
| 6,881,647 B2 * | 4/2005 | Stanbery ....................... | 438/455 |
| 7,087,309 B2 * | 8/2006 | Kriltz ........................... | 428/432 |
| 7,148,123 B2 * | 12/2006 | Stanbery ....................... | 438/455 |
| 7,319,190 B2 * | 1/2008 | Tuttle ........................... | 136/264 |
| 2004/0087172 A1 | 5/2004 | Probst | |
| 2004/0144419 A1 | 7/2004 | Fix et al. | |
| 2004/0261841 A1 | 12/2004 | Negami et al. | |
| 2005/0028861 A1 | 2/2005 | Aoki et al. | |
| 2005/0072461 A1 | 4/2005 | Kuchinski et al. | |
| 2005/0186342 A1 | 8/2005 | Sager et al. | |
| 2005/0236032 A1 | 10/2005 | Aoki | |
| 2005/0253142 A1 | 11/2005 | Negami et al. | |
| 2005/0257825 A1 | 11/2005 | Ramanathan et al. | |
| 2005/0284518 A1 | 12/2005 | Yamada et al. | |

FOREIGN PATENT DOCUMENTS

| | | |
|---|---|---|
| DE | 43 33 407 | 11/1994 |
| RU | 2 170 994 | 7/2001 |
| WO | WO 2004/032180 | 4/2004 |

OTHER PUBLICATIONS

Greenhunt, Victor A., "Effects of Composition, Processing, and Structure on Properties of Ceramics and Glasses, ASM Handbook", ASM Publishing (2002) vol. 20.*

Palm, et al., "CIS module pilot processing applying concurrent rapid selenization and sulfurization of large area thin film precursors" (2003) Thin Solid Films vol. 431-432, pp. 514-522.*

(Continued)

*Primary Examiner* — Jennifer Michener
*Assistant Examiner* — Matthew Martin
(74) *Attorney, Agent, or Firm* — Nixon & Vanderhye P.C.

(57) ABSTRACT

An electrode structure is provided for use in an electronic device. In certain example embodiments, an electrode structure includes a supporting glass substrate (e.g., soda-lime silica based float glass), a buffer layer (e.g., $Si_xN_y$), and a conductive electrode (e.g., Mo) provided in this order. The buffer layer is advantageous in that it prevents or reduces sodium (Na) migration from the glass substrate into semiconductor layer(s) of the electronic device.

23 Claims, 2 Drawing Sheets

OTHER PUBLICATIONS

Berthold et al., "Glass to Glass Anodic Bonding" (1999) STW publishing.*

Rudmann et al., "Sodium incorporation strategies for CIGS growth at different temperatures" (2005) Thin Solid Films vol. 480-481, pp. 55-60.*

Scofield et al., "Sodium diffusion, selenization, and microstructural effects associated with various molybdenum back contact layers for CIS-based solar cells", IEEE 1995.*

"12.8% Efficiency Cu (In, Ga) $Se_2$ Solar Cell on a Flexible Polymer Sheet", Tiwari et al., Thin Film Physics Group, Institute of Quantum Electronics, Jul. 21, 1999 (1pg).

"Na Incorporation into Cu (In, Ga) $Se_2$ for High-Efficiency Flexible Solar Cells on Polymer Foils", Rudmann et al., Thin-Film Physics Group, Oct. 12, 2004, Journal of Applied Physics 97 (5pgs).

"CIS Module Pilot Processing Applying Concurrent Rapid Selenization and Sulfurization of Large Area Thin Film Precursors", Palm et al., Thin Solid Films 431-432 (2003) 514-522.

"A Comprehensive Characterization of the Interfaces in Mo/CIS/CdS/ZnO Solar Cell Structures", Schmid et al., Solar Energy Materials and Solar Cells 41/42 (1996) 281-294.

* cited by examiner

ELECTRODE STRUCTURE FOR USE IN ELECTRONIC DEVICE AND METHOD OF MAKING SAME

This invention relates to an electrode structure for use in an electronic device. In certain example embodiment, an electrode structure includes a supporting glass substrate (e.g., soda-lime silica based float glass), a buffer layer (e.g., $Si_xN_y$), and a conductive electrode (e.g., Mo) provided in this order. The buffer layer is advantageous in that it prevents or reduces sodium (Na) migration from the glass substrate into semiconductor layer(s) of the electronic device (e.g., solar cell or other suitable electronic device). A method of making the same is also provided.

BACKGROUND OF THE INVENTION

Back electrodes for solar cells and the like are known in the art. For example and without limitation, see U.S. Patent Document Nos. 2004/0261841, 2005/0253142, U.S. Pat. No. 5,981,868, 2005/0236032, U.S. Pat. No. 5,477,088, 2005/0186342, 2005/0257825, 2005/0284518, 2004/0087172, and 2005/0072461, the disclosures of which are hereby incorporated herein by reference.

Back electrodes for electronic devices such as CIS (copper indium diselenide) and CIGS (copper indium gallium diselenide) based solar cells are typically made of a layer of Mo which is sputter-deposited directly onto a substrate. In certain applications, the substrate may be made of glass such as soda-lime-silica based glass. After a series of following depositions and scribing/patterning steps, the device is completed by bus bar contacts, encapsulation and framing. Each component of the device contributes to efficiency.

With respect to glass substrates, soda-lime-silica based float glass contains Na (e.g., in the form of $Na_2O$). It is known that sometimes one desires to provide Na in a polycrystalline CIGS absorber layer so as to increase solar cell efficiencies. Accordingly, unlike many other electo-optical coatings, CIS and CIGS are typically fairly sodium friendly. However, if one decides to introduce Na into a CIS and/or CIGS absorbing layer, it is important that the sodium be introduced in a controllable and predictable manner.

In making solar cells and other electronic devices, semiconductor layers are often subjected to significant heat treating during the manufacturing process. Such heat treating may include subjecting the glass substrate and the semiconductor layer(s) to temperatures of at least 400 degrees C., sometimes at least 500 degrees C., and possibly higher temperatures. Unfortunately, such heat treating temperatures often cause diffusion of Na from the glass substrate into the coating in an uncontrollable and predictable manner. This means that uncontrolled and unpredictable amounts of sodium can diffuse from the glass substrate into a CIGS or CIS layer in a solar cell or other electronic device, which can lead to undesirable and/or unpredictable functionality in certain instances.

In view of the above, it will be apparent that there exists a need in the art for a technique to prevent or reduce uncontrolled sodium migration into semiconductor layer(s) of solar cells or other electronic devices.

BRIEF SUMMARY OF EXAMPLE EMBODIMENTS OF THE INVENTION

In certain example embodiments of this invention, an electrode structure is provided for use in solar cells and the like. In certain example embodiments, an electrode structure includes a supporting glass substrate (e.g., soda-lime silica based float glass), a buffer layer (e.g., $Si_xN_y$), and a conductive electrode (e.g., Mo) provided in this order. The buffer layer is advantageous in that it prevents or reduces sodium (Na) migration from the glass substrate, through the Mo back electrode, and into semiconductor layer(s) of the electronic device (e.g., solar cell or other suitable electronic device). Thus, if desired, sodium may be added to the semiconductor layer from above in a post-deposition treatment (i.e., not from the glass). The buffer layer may be of silicon nitride, and may include oxygen and/or other element(s) as well in certain example embodiments of this invention. The buffer layer may be made up of a single layer or multiple layers in different example embodiments of this invention.

In certain example embodiments of this invention, the buffer layer comprises silicon nitride which is Si-rich. For example, and without limitation, the buffer layer may comprise $Si_xN_y$, where x/y is at least 0.76, more preferably at least 0.80, even more preferably at least 0.85, and possibly at least 0.90. It has surprisingly been found that Si-rich silicon nitride is a better absorber of Na from the glass than is stoichiometric $Si_3N_4$.

Other example advantages of the buffer layer relate to better control of the mechanical and/or efficiency properties of the electrode layer and/or electronic device. The Mo electrode layer acts as a nucleation layer for the CIS/CIGS stack in certain example embodiments. By controlling the deposition parameters of the buffer layer, it is possible to achieve the desired properties of the Mo electrode layer and in turn to also achieve a desired degree of selenization of the absorber layer, and so forth. The high line speed and deposition pressures used in sputtering vacuum coaters are also favorable in producing a more open metal (e.g., Mo) surface, resulting in a better adhesion between the absorber and Mo to form a $MoSe_{2-x}O_x$ transition layer at the Mo/absorber interface, which is optional in certain example embodiments of this invention. This $MoSe_{2-x}O_x$ transition layer at the Mo/absorber interface in certain example embodiments of this invention contributes to higher efficiencies of the CIS or CIGS layer.

In certain example embodiments of this invention, the buffer layer is from about 10-1000 nm thick, more preferably from about 100-500 nm thick, and most preferably from about 100-200 nm thick (e.g., 150 nm thick). Moreover, in certain example embodiments of this invention, the electrode layer (e.g., Mo based layer) is from about 50-1000 nm thick, more preferably from about 100 to 900 nm thick, and most preferably from about 200 to 600 nm thick (e.g., about 440 nm thick).

In certain example embodiments of this invention, there is provided a solar cell comprising: a glass substrate comprising $SiO_2$ (67-75%), $Na_2O$ (10-20%), CaO (5-15%), MgO (0-7%), $Al_2O_3$ (0-5%), $K_2O$ (0-5%); a buffer layer comprising silicon nitride formed on and in direct contact with the glass substrate; a back electrode comprising Mo formed on and in direct contact with the buffer layer comprising silicon nitride; an absorber layer formed on the back electrode comprising Mo; and a front electrode. In certain example instances, a window layer may be provided between the absorber layer and the front electrode.

In other example embodiments of this invention, there is provided a electronic device comprising: a glass substrate comprising $SiO_2$ and $Na_2O$; a buffer layer comprising silicon nitride formed on (directly or indirectly) the glass substrate; a conductive electrode comprising Mo, Al and/or Cr formed on (directly or indirectly) the buffer layer comprising silicon nitride; and a semiconductor layer comprising at least one element of each of groups IB, IIIA, and VIA formed on the conductive electrode.

In other example embodiments of this invention, there is provided a method of making an electronic device, the method comprising: providing a glass substrate comprising $SiO_2$ and $Na_2O$, the glass substrate supporting a buffer layer comprising silicon nitride formed on and in direct contact with the glass substrate and a conductive electrode comprising Mo, Al and/or Cr formed on and in direct contact with the buffer layer comprising silicon nitride; forming a semiconductor layer comprising at least one element of each of groups IB, IIIA, and VIA on the conductive electrode; and using a heat treatment at a temperature of at least about 350 degrees C. to introduce sodium into the semiconductor layer.

DETAILED DESCRIPTION OF EXAMPLE EMBODIMENTS OF THE INVENTION

Figure 1:
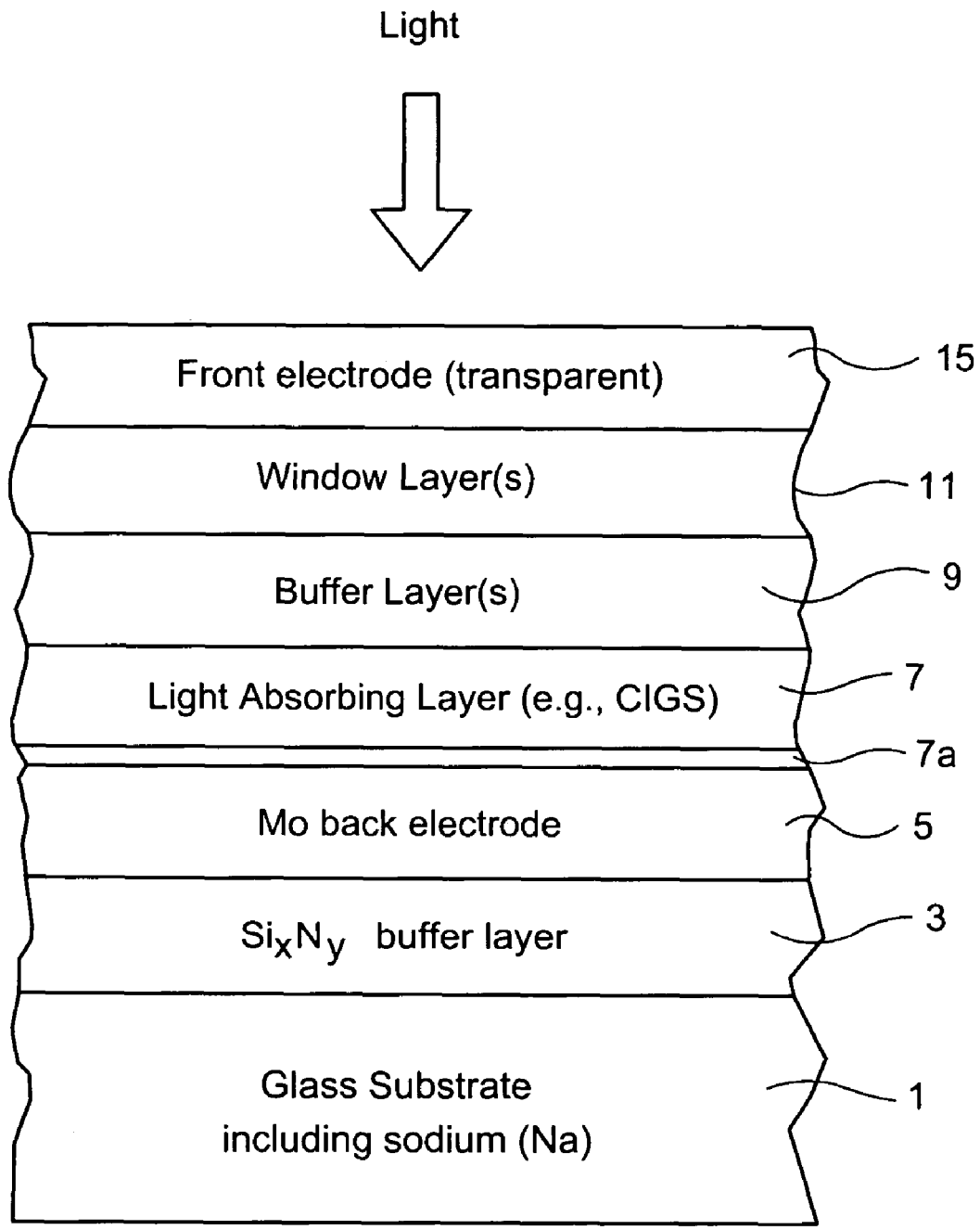
FIG. 1 is a cross sectional view of a solar cell according to an example embodiment of this invention.

Referring now more particularly to the accompanying drawings in which like reference numerals indicate like parts throughout the several views.

FIG. 1 is a cross sectional view of a solar cell according to an example embodiment of this invention. The solar cell includes glass substrate 1 which may be soda-lime-silica based float glass (e.g., 1-10 mm thick) in certain example embodiments of this invention, buffer layer 3 for reducing or preventing diffusion of sodium outwardly from the glass substrate, conductive electrode layer 5, optional transition layer 7a, semiconductor radiation or light absorbing layer 7, optional buffer layer 9, window layer 11, and front electrode 15.

In certain example embodiments the electrode structure includes glass substrate 1, a buffer layer (e.g., $Si_xN_y$) 3, and a conductive electrode (e.g., Mo) 5 provided in this order. The buffer layer 3 is advantageous in that it prevents or reduces sodium (Na) migration from the glass substrate 1 into semiconductor layer(s) 7 of the electronic device (e.g., solar cell or other suitable electronic device). Thus, if desired, sodium may be added to the semiconductor layer 7 from above in a post-deposition treatment—this is optional. Layers 3, 5 and 7 are continuous across the substrate, or at least across a substantial part of the substrate, and have no apertures or holes defined therein, in certain example embodiments of this invention.

Glass substrate 1 may be soda-lime-silica based float glass in certain example embodiments of this invention. An exemplary soda-lime-silica based glass according to certain embodiments of this invention, on a weight percentage basis, includes the following basic ingredients:

TABLE 1

EXAMPLE BASE GLASS

| Ingredient | Wt. % |
|---|---|
| $SiO_2$ | 67-75% |
| $Na_2O$ | 10-20% |
| CaO | 5-15% |
| MgO | 0-7% |

TABLE 1-continued

EXAMPLE BASE GLASS

| Ingredient | Wt. % |
|---|---|
| $Al_2O_3$ | 0-5% |
| $K_2O$ | 0-5% |
| BaO | 0-1% |

Other minor ingredients, including various conventional refining aids, such as $SO_3$, carbon, and the like may also be included in the base glass. In certain embodiments, for example, glass herein may be made from batch raw materials silica sand, soda ash, dolomite, limestone, with the use of salt cake ($SO_3$) and/or Epsom salts (e.g., about a 1:1 combination of both) as refining agents. Preferably, soda-lime-silica based glasses herein include by weight from about 10-15% $Na_2O$ and from about 6-12% CaO. In this regard, note the significant amounts of sodium (Na) in the glass which may be subject to diffusion during high temperature conditions. Moreover, in addition to the above materials, colorants such as iron oxide and/or other colorants may also be present in the glass in suitable amounts.

The buffer layer 3 may be of or include silicon nitride, and may include oxygen and/or other element(s) such as Al in certain example embodiments of this invention. The buffer layer 3 may be made up of a single layer or multiple layers in different example embodiments of this invention. In certain example embodiments of this invention, the buffer layer 3 is of or includes silicon nitride which is Si-rich. For example, and without limitation, the buffer layer 3 may be of or include $Si_xN_y$, where x/y is at least 0.76, more preferably at least 0.80, even more preferably at least 0.85, and possibly at least 0.90. Moreover, in certain example embodiments, this ratio x/y is typically less than 2, more preferably less than about 1.5. It has surprisingly been found that Si-rich silicon nitride is a better absorber of Na from the glass 1 than is stoichiometric $Si_3N_4$. In certain example embodiments of this invention, the buffer layer 3 is from about 10-1000 nm thick, more preferably from about 100-500 nm thick, and most preferably from about 100-200 nm thick (e.g., 150 nm thick). The buffer layer 3 may be deposited via sputtering or the like in certain example embodiments of this invention. The buffer layer 3 may also include aluminum and/or oxygen in certain example instances (in addition to the silicon nitride). In certain example embodiments, the buffer layer 3 includes from about 1-15% aluminum, and/or from about 1-25% oxygen, more preferably from about 2-20% oxygen.

Buffer layer 3 is oxygen graded in certain example embodiments of this invention. For example and without limitation, when buffer layer 3 is of silicon oxynitride, the buffer layer 3 is oxygen graded so that it is more oxided adjacent the interface with the glass substrate 1 than at the interface adjacent the conductive back electrode 5. In particular, in buffer layer 3 there is more oxygen present in the layer at a portion thereof close to the glass substrate 1 than in another portion thereof closer to the back electrode 5. The oxidation grading may or may not be continuously progressive in different embodiments of this invention. In certain example embodiments of this invention, such oxidation grading of the buffer layer 3 is advantageous in that it permits better optical matching at the interface with the glass substrate 1 with respect to refractive index or the like. This may permit optics and/or adhesion to be improved.

Back side conductive electrode 5 is typically of or includes Mo in certain example embodiments of this invention. In certain example embodiments of this invention, the electrode layer 5 (e.g., Mo based layer, which may be metallic in certain example embodiments) is from about 50-1000 nm thick, more preferably from about 100 to 900 nm thick, and most preferably from about 200 to 600 nm thick (e.g., about 440 nm thick). While the back side electrode 5 is of Mo in certain example, embodiments, the electrode 5 may instead be of a Mo—Ni alloy, aluminum, steel, a Cr-based alloy, or other metal or hybrid composition in other example embodiments of this invention. Electrode layer 5 may be deposited via sputtering, electroplating, or the like in different example embodiments of this invention.

Semiconductor absorbing layer 7 may be a CIGS (copper indium gallium diselenide) based layer in certain example embodiments of this invention. In certain example embodiments of this invention, the absorber layer 7 may include material containing elements of groups IB, IIIA, and VIA. In certain example embodiments, the absorbing layer 7 includes copper (Cu) as the group IB element(s), Gallium (Ga) and/or Indium (In) and/or aluminum as group IIIA element(s), and selenium (Se) and/or sulfur (S) as group VIA element(s). The absorber layer 7 may be fabricated using a sequence of atomic layer depositions on the base electrode 5 in certain example instances, and may be from about 500-2000 nm thick in different example embodiments of this invention. Alternatively, absorbing layer 7 may be of any of the absorbing layer materials described in any of U.S. Patent Document Nos. 2004/0261841, 2005/0253142, U.S. Pat. No. 5,981,868, 2005/0236032, U.S. Pat. No. 5,477,088, 2005/0186342, 2005/0257825, 2005/0284518, 2004/0087172, and 2005/0072461, the disclosures of which are hereby incorporated herein by reference.

After absorbing layer 7 has been formed, the device (e.g., with or without any other layer(s)) may be subjected to heat treatment. For example and without limitation, the device including layer 7 may be subjected to heat treating temperatures of at least about 400 degrees C., sometimes at least about 500 degrees C., and possibly higher temperatures. Such heat treatment may be performed, for example, during a step of applying a sodium inclusive solution over the layer 7 and heat treating to cause sodium to diffuse into the layer 7 thereby adding sodium to the layer 7 in a controlled and predictable manner. For example and without limitation, sodium diffusion into layer 7 may be performed by depositing about 30 nm of a Na inclusive precursor such as NaF onto a grown and cooled absorbing layer 7, followed by annealing at about 400 degrees C. or higher in a vacuum to let the sodium diffuse into the absorber layer 7. It is noted that a Na inclusive precursor such as $Na_2S$ and/or $Na_2Se$ could be used instead of or in addition to the NaF. Thus, in certain example embodiments the absorber layer 7 also includes a small amount of sodium (e.g., from about 0.05 to 2% sodium, more preferably from about 0.1 to 1% sodium). Another example of possible heat treatment is the growing of layer 7 itself at temperatures of at least about 350 degrees C., and possibly at least about 400 degrees C. in certain example embodiments of this invention. Alternatively, the Na inclusive precursor may be applied directly over the Mo electrode so as to be located immediately under the absorber layer 7 when it is grown; and heat (e.g., at least about 350 degrees C., and possibly at least about 400 degrees C.) used in growing the absorber layer 7 can be used to cause the sodium to diffuse into at least part of the layer 7 as it is grown.

Window layer 11 may be used as a junction partner for the absorber layer 7. For example, the junction partner layer 11 may include cadmium sulfide, zinc sulfide, or zinc selenide or a combination of these in certain example embodiments of this invention. This layer may be deposited by chemical bath deposition or chemical surface deposition, to a thickness of from about 50-100 nm, in certain example instances. In certain example instances, the combination of at least the layers 7 and 11 may be referred to as an absorber layer.

Front conductive electrode 15 is substantially transparent in certain example embodiments of this invention. Front electrode 15 may be a transparent conductive oxide (TCO) layer in certain example instances. Electrode 15 may be of or include zinc oxide, aluminum doped zinc oxide, ITO, or the like in certain example embodiments of this invention. This electrode 15 may be formed by sputtering, evaporation, CVD, electroplating, or the like in different example embodiments of this invention.

In addition to the front electrode 15, it is possible for a layer of metal (e.g., Ni, Al or Ag) finger(s) (not shown) to be provided over electrode 15, or in place of electrode 15, in certain example embodiments of this invention. This may be done to reduce overall sheet resistance, and/or to provide electrical contact(s).

Buffer layer 9 is optional. Buffer layer 9 is not present in many embodiments. In certain example embodiments, interfacial buffer layer 9 may be of or include a semiconductor such as a thin film transparent Group II-VI compound semiconductor with high resistance which may contain a hydroxide.

In addition to the above, other example advantages of the buffer layer 3 relate to better control of the mechanical and/or efficiency properties of the electrode layer 5 or electronic device. The back electrode layer 5 (e.g., of Mo) acts as a nucleation layer for the CIS/CIGS stack in certain example embodiments. By controlling the deposition parameters of the buffer layer 3, it is possible to achieve the desired properties of the Mo electrode layer 5 and in turn to also achieve a desired degree of selenization of the absorber layer 7, and so forth. The high line speed and deposition pressures used in sputtering vacuum coaters are also favorable in producing a more open metal (e.g., Mo) surface for layer 5, resulting in a better adhesion between the absorber 7 and Mo of layer 5 to form a $MoSe_{2-x}O_x$ (x may be from about 0 to 1.99, more preferably from about 0.1 to 1.9 in certain example instances) transition layer 7a at the Mo/absorber interface as shown in FIG. 1, which is optional in certain example embodiments of this invention. This $MoSe_{2-x}O_x$ inclusive transition layer 7a at the Mo/absorber interface in certain example embodiments of this invention contributes to higher efficiencies of the CIS or CIGS layer.

Figure 2:
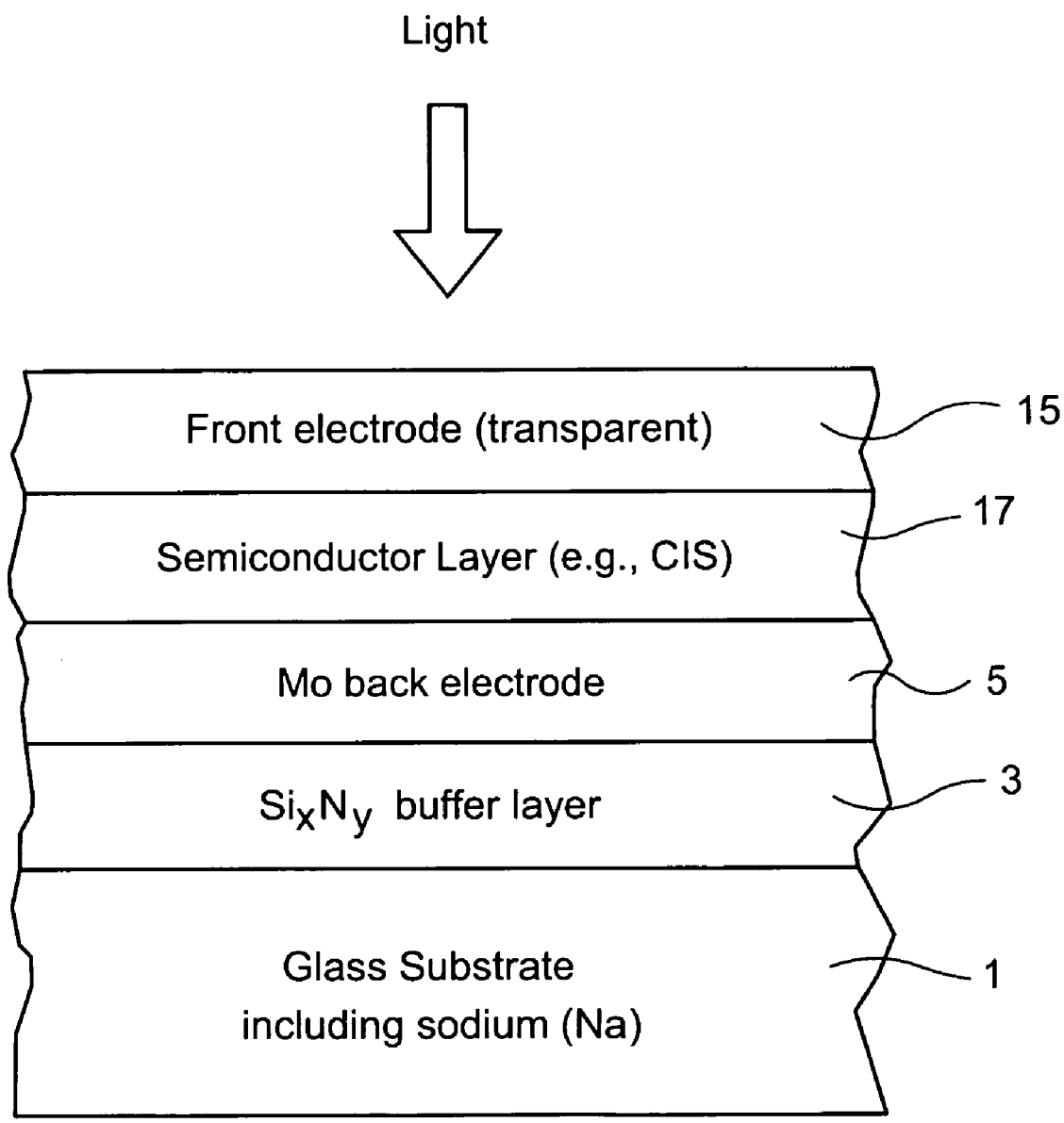
FIG. 2 is a cross sectional view of a solar cell according to another example embodiment of this invention.

FIG. 2 is a cross sectional view of a solar cell according to another example embodiment of this invention. The solar cell of FIG. 2 is similar to that of FIG. 1, except that layers 7-11 of the FIG. 1 embodiment are replaced with at least a semiconductor layer(s) 17. In certain example embodiments, the semiconductor layer 17 may be of or include an absorbing layer such as copper indium diselenide (CIS). Additional semiconductor layer(s) may also be present above layer 17 in certain example instances.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A solar cell comprising:
   a glass substrate comprising:

| Ingredient | Wt. % |
   |---|---|
   | $SiO_2$ | 67-75% |
   | $Na_2O$ | 10-20% |
   | CaO | 5-15% |
   | MgO | 0-7% |
   | $Al_2O_3$ | 0-5% |
   | $K_2O$ | 0-5% | a buffer layer comprising a silicon-inclusive dielectric material formed on and in direct contact with the glass substrate;
   a back electrode comprising Mo formed on and in direct contact with the buffer layer;
   an absorber layer formed on the back electrode comprising Mo;
   a transition layer comprising $MoSe_{2-x}O_x$ at an interface between the back electrode and the absorber layer, wherein x is 0.1-1.9: and
   a front electrode.

2. The solar cell of claim 1, wherein the absorber layer comprises copper indium diselenide and/or copper indium gallium diselenide.

3. The solar cell of claim 1, wherein the absorber layer comprises at least one element of each of groups IB, IIIA, and VIA.

4. The solar cell of claim 3, wherein the absorber layer comprises copper as a group IB element; one or more of gallium, indium and/or aluminum as group IIIA element(s); and selenium and/or sulfur as group VIA element(s).

5. The solar cell of claim 1, where the buffer layer further comprises oxygen and/or aluminum.

6. The solar cell of claim 1, wherein the buffer layer is from about 100-500 nm thick.

7. The solar cell of claim 1, wherein the absorber layer further comprises sodium.

8. The solar cell of claim 1, wherein the absorber layer further comprises from about 0.05% to 2% sodium.

9. The solar cell of claim 1, wherein the buffer layer further includes oxygen, and wherein the buffer layer includes more oxygen at a location closer to the glass substrate than at another location therein farther from the glass substrate.

10. The solar cell of claim 1, wherein the silicon-inclusive dielectric material of the buffer layer comprises silicon nitride.

11. The solar cell of claim 10, wherein the silicon nitride of the buffer layer is characterized by $Si_xN_y$, where x/y is at least 0.76.

12. The solar cell of claim 11, wherein the silicon nitride of the buffer layer is characterized by $Si_xN_y$, where x/y is at least 0.80.

13. The solar cell of claim 11, wherein the silicon nitride of the buffer layer is characterized by $Si_xN_y$, where x/y is at least 0.85.

14. An electronic device comprising:
    a glass substrate comprising $SiO_2$ and $Na_2O$;
    a buffer layer comprising a silicon-inclusive dielectric material formed on the glass substrate;
    a conductive electrode comprising Mo, Al and/or Cr formed on the buffer layer;
    a semiconductor layer comprising at least one element of each of groups IB, IIIA, and VIA formed on the conductive electrode; and
    a transition layer comprising Mo and $O_x$ at an interface between the conducive electrode and the semiconductor layer, wherein x is 0.1-1.9.

15. The electronic device of claim 14, wherein the semiconductor layer comprises copper as a group IB element; one or more of gallium, indium and/or aluminum as group IIIA element(s); and selenium and/or sulfur as group VIA element(s).

16. The electronic device of claim 14, where the buffer layer further comprises oxygen and/or aluminum.

17. The electronic device of claim 14, wherein the semiconductor layer further comprises from about 0.05 to 2% sodium.

18. The electronic device of claim 14, wherein the silicon-inclusive dielectric material of the buffer layer comprises silicon nitride.

19. The electronic device of claim 18, wherein the silicon nitride of the buffer layer is characterized by $Si_xN_y$, where x/y is at least 0.76.

20. The electronic device of claim 18, wherein the silicon nitride of the buffer layer is characterized by $Si_xN_y$, where x/y is at least 0.80.

21. A method of making an electronic device, the method comprising:
    providing a glass substrate comprising $SiO_2$ and $Na_2O$, the glass substrate supporting a buffer layer comprising a silicon-inclusive dielectric material formed on and in direct contact with the glass substrate and a conductive electrode comprising Mo, Al and/or Cr formed on and in direct contact with the buffer layer;
    forming a semiconductor layer comprising at least one element of each of groups IB, IIIA, and VIA on the conductive electrode, a transition layer comprising Mo and $O_x$ at an interlace also being formed between the conducive electrode and the semiconductor layer, wherein x is 0.1-1.9; and
    using a heat treatment at a temperature of at least about 350 degrees C. to introduce sodium into the semiconductor layer.

22. The method of claim 21, wherein the sodium that is introduced into the semiconductor layer does not come from the glass substrate, wherein the electronic device is a solar cell, and wherein the semiconductor layer comprises copper as a group IB element; one or more of gallium, indium and/or aluminum as group IIIA element(s); and selenium and/or sulfur as group VIA element(s).

23. The method of claim 21, wherein the silicon-inclusive dielectric material of the buffer layer comprises silicon nitride.

* * * * *